United States Patent [19]

Ohashi

[11] 4,041,784
[45] Aug. 16, 1977

[54] ACTUATOR FOR PUSH BUTTON TUNER

[75] Inventor: Tamaki Ohashi, Tanashi, Japan

[73] Assignee: Nihon Technical Kabushiki Kaisha, Japan

[21] Appl. No.: 577,712

[22] Filed: May 15, 1975

[30] Foreign Application Priority Data

May 20, 1974 Japan ................... 49-55376

[51] Int. Cl. ............................................. F16H 35/18
[52] U.S. Cl. ..................... 74/10.33; 74/10.27; 74/10.35; 334/7
[58] Field of Search ............... 74/10.33, 10.31, 10.27, 74/10.35, 10.37; 334/7

[56] References Cited

U.S. PATENT DOCUMENTS

| 3,463,017 | 8/1969 | Stamm et al. | 334/7 |
| Re. 27,179 | 9/1971 | Newman | 74/10.27 |

Primary Examiner—Samuel Scott
Assistant Examiner—Randall Heald
Attorney, Agent, or Firm—Robert E. Burns; Emmanuel J. Lobato; Bruce L. Adams

[57] ABSTRACT

An actuator for a pushbutton tuner comprises a pushbutton slide, a pair of slideable tuning slides, interconnecting means for selectively connecting the pushbutton slide with either one of the pair of tuning slides, and shift means for controlling the connecting state of the interconnecting means. The interconnecting means comprises a pair of interconnecting members each comprised of flexible material and each being connected at one end to respective ones of the tuning slides and having means at the other end for selectively engaging with the pushbutton slide. Movement of the shift means in one direction effects corresponding movement of one interconnecting member to its operative position simultaneously with movement of the other interconnecting member to its inoperative position and movement of the shift means in the other direction effects the reverse movement of the interconnecting members.

3 Claims, 5 Drawing Figures

ACTUATOR FOR PUSH BUTTON TUNER

BACKGROUND OF THE INVENTION

The invention relates to an actuator of a pushbutton tuner, and more particularly to a band switching mechanism which operatively connects a pushbutton slide with a selected one of a pair of tuning slides which are disposed on the opposite sides of the pushbutton slide.

A pushbutton tuner is known in which a pushbutton slide is adapted to be selectively connected with either one of a pair of tuning slides. In a tuner of this type, one of the pair of tuning slides is designed for the AM broadcasting band while the other is designed for the FM band. The selection is made by the operation of an interconnecting member. In the conventional actuator, the interconnecting member is pivotally mounted on the pushbutton slide and is adapted to tilt either lateral side for engagement with either one of the tuning slides as shift means is manually operated. Each tuning slide is formed with a slot or notch which receives part of the interconnecting member.

An interconnecting member which comprises a toggle lever having a pair of wing portions and a stem is known. When this interconnecting member is operated, either one of the pair of wing portions is received in the slot of a selected tuning slide. With the interconnecting member of this type, the stem is pivotally mounted on a pin wich is provided on the pushbutton slide. However, the stem is liable to deformation because of the load imposed in the direction of the thickness of the stem. Such deformation of the stem is undesirable since it tends to upset the preset alignment between the pair of wing portions and the slots of the pair of tuning slides.

On the other hand, there is known another type of interconnecting member having a pair of arms extending from a body portion in which an opening is formed for pivotally connecting with a sleeve-shaped portion on the pushbutton slide. Except for the fulcrum, this interconnecting member operates generally in the similar manner as the previous one, but the opening and the sleeve-shaped portion must be manufactured and assembled with a very close tolerance in order to achieve a smooth cooperation.

SUMMARY OF THE INVENTION

Therefore, it is an object of the invention to provide an actuator of a pushbutton tuner which is simple in structure, using parts which can be easily manufactured and assembled.

It is another object of the invention to provide an actuator of a pushbutton tuner in which interconnecting means which operatively connects a pushbutton slide with a selected one of a pair of tuning slides maintains a proper alignment over a prolonged period of time.

In the actuator according to the invention, interconnecting means comprises a pair of interconnecting members which are carried by a pair of tuning slides, respectively. Each interconnecting member is provided with means for selectively engaging with the pushbutton slide, and means for engaging with shift means. In response to an operation of the shift means, one of the interconnecting members engages with the pushbutton slide while the other is disengaged therefrom.

In accordance with another aspect of the invention, the pair of interconnecting members each comprises a body portion formed of a resilient material of a flexible material which is permanently secured at its one end to the respective tuning slides. The body portion remains substantially stationary except for its elastic deformation or elastic recovery.

BRIEF DESCRIPTION OF THE DRAWINGS

The above and other objects, features and advantages of the invention will become apparent from the following detailed description of an embodiment thereof shown in the drawings, in which.

BRIEF DESCRIPTION OF THE PREFERRED EMBODIMENTS

Figure 1:
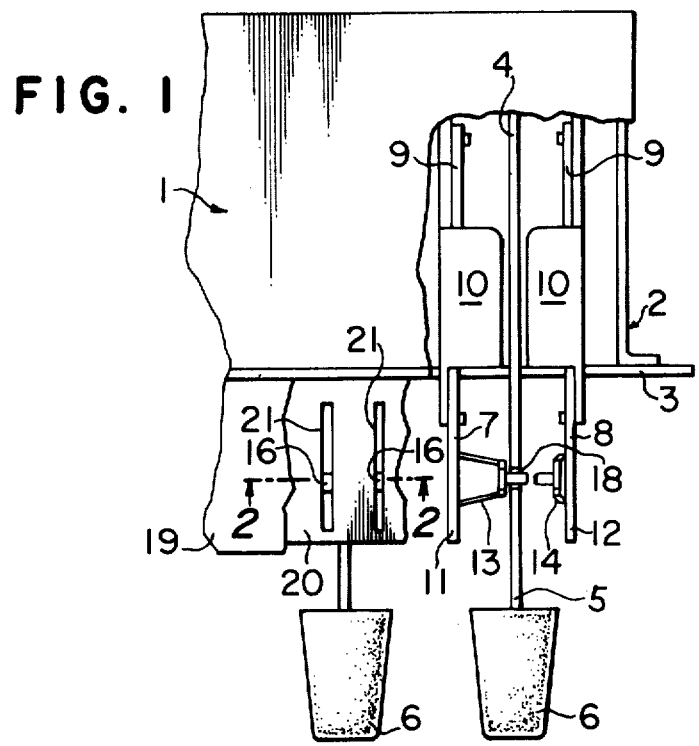
FIG. 1 is a plan view, partly cut away, of the pushbutton tuner constructed in accordance with the invention.

In the description to follow, it should be understood that a tuning mechanism 1 with which the actuator according to the invention is to be used is not shown in detail for the clarity and brevity of description, and may be of any conventional design.

As in a conventional double band pushbutton tuner, the actuator in either embodiment of the invention comprises a plurality of pushbutton slides 4 which extend through a front wall of a framework 2 in generally parallel arrangement. Each pushbutton slide 4 is provided with a pushbutton 6 at the end 5 of its forward extension, and is slidably mounted in a stationary guide channel formed in the framework 2 so as to slide from a forward inoperative position to a rearward operative position as the pushbutton 6 is operated. The terms "forward" and "rearward" as used herein are intended to mean a lower portion and an upper portion of the pushbutton slide, respectively, as viewed in FIGS. 1 and 4. A pair of tuning slides 7, 8 are disposed on the opposite sides of each pushbutton slide 4, and is provided with tuning cams 9 and associated positioning means 10 as is well known in the art. Each of the tuning slides 7, 8 are slidably mounted in stationary guide channels formed in the framework 2 so as to slide between their forward inoperative position and rearward operative position. While the forward end 11, 12 of the pair of tuning slides 7, 8 is shown as disposed at an equal distance from the end of the pushbutton slide 4, this does not represent an essential limitation.

Figure 2:
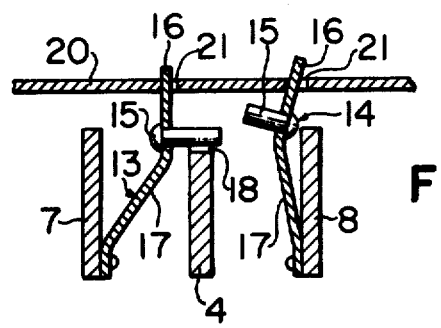
FIG. 2 is a cross section taken along the line 2—2 shown in FIG. 1.

In the embodiment shown in FIGS. 1 and 2, there is provided a pair of interconnecting members generally shown by reference numerals 13, 14 which operatively connect the pushbutton slide 4 with either one of the pair of tuning slides 7, 8 selectively. Each of the interconnecting members 13, 14 comprises at plate-shaped body portion 17 having a laterally extending pin 15, adjacent to its one end, and an upwardly extended pin 16. At their other end, the body portions 17 are permanently secured to the side of th extensions 11, 12 of the pair of tuning slides 7, 8 in a manner such that the laterally extending pins 15 extend toward each other. When the extensions 11, 12 are at an equal distance from the end 5 of the pushbutton slide 4, the pair of interconnecting members 13, 14 may be formed in the identical configuration and size. A notch 18 is formed in the end 5 of the pushbutton slide 4, and assumes a position which is aligned with the laterally extending pins 15 of the interconnecting members 13, 14 of the respective tuning slides 7, 8 when the pushbuttons slide 4 and the pair of tuning slides 7, 8 are in their forward inoperative positions. It is to be noted that the notch 18 may be replaced by a slot.

In the present embodiment, the body portion 17 of the respective interconnecting members 13, 14 is formed of a resilient material or a flexible material. Normally, the body portion 17 is located so as to disengage the pin 15 from the notch 18, but permits an engagement therebetween when it is urged to assume a curved position. However, under certain instances, the body portion 17 may be formed so as to resiliently urge the laterally extending pins 15 toward the notch 18 normally. Alternatively, the body portion may comprise a snap action member adapted for critical movement between one operational position in which one of the laterally extending pins 15 engages with the notch 18 and the other operational position in which they are disengaged from each other.

All the interconnecting members 13, 14 on the pairs of tuning slides 7, 8 are concurrently displaced from one operational position to the other by a shift plate 20 which is mounted on the support plate 19 of the framework 2 for lateral movement. The shift plate 20 is formed with a plurality of elongate slots 21, each pair of which is associated with each pair of tuning slides 7, 8 and their associated interconnecting members 13, 14. The upright pins 16 at the free end of the respective interconnecting members 13, 14 is constrained in the slot 21 in any position of the tuning slides 7, 8 which carry these interconnecting members. While not shown, the support plate 19 and the shift plate 20 are connected together in a known manner so that the shift plate can be moved laterally in response to a manual operation of a switching lever.

When the shift plate 20 has moved to the right, all the interconnecting members 13, 14 are displaced to the right. The interconnecting member 13 operatively connects the tuning slide 7 with the pushbutton slide 4, while the interconnecting member 14 disengages the tuning slide 8 from the pushbutton slide 4. As the pushbutton slide 4 moves from its forward inoperative position to its rearward operative position, the interconnecting member 13 causes the tuning slide 7 to move simultaneously with the pushbutton slide 4. Specifically, the upright pin 16 of the interconnecting member 13 moves along the slot 21 in the shift plate 20, maintaining the operative connection therebetween. When the shift plate 20 has moved to the left, all the interconnecting members 13, 14 are displaced to the left, and now the interconnecting member 14 assumes an operative position, instead of the other interconnecting member 13. As the pushbutton slide 4 is depressed or moved inwardly under the condition that the pushbutton slide 4 is operatively connected with a selected tuning slide 7 or 8, a load is impressed on both the pin 15 and the body portion 17 in a direction crosswise of the body portion 17, thus substantially avoiding a deformation thereof and assuring a movement of the pushbutton slide 4 and the selected tuning slide 7 or 8 as a unit.

Figure 3:
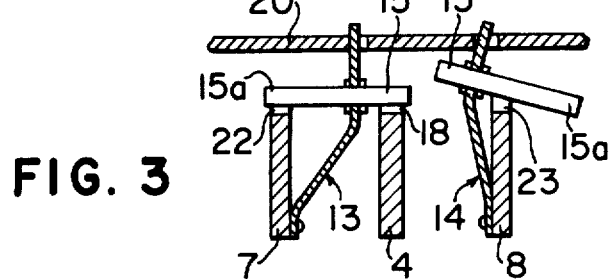
FIG. 3 is a similar cross section of interconnecting means which is slightly modified from that shown in FIG. 2.

FIG. 3 shows a modified form of interconnecting members 13, 14 which is similar to the previous embodiment except that the laterally extending pins 15 have an extension 15a which extends away from the end at which they engage the pushbutton slide, the extensions 15a normally engaging a pair of notches 22, 23 formed in the end of the tuning slides 7, 8 which carry these interconnecting members 13, 14. With this arrangement, in the operative position of the interconnecting member 13 or 14, the laterally extending pin 15 thereof provides a connection between the pushbutton slide 4 and a selected tuning slide, thereby reducing the load impressed on the body portion 17.

Figure 4:
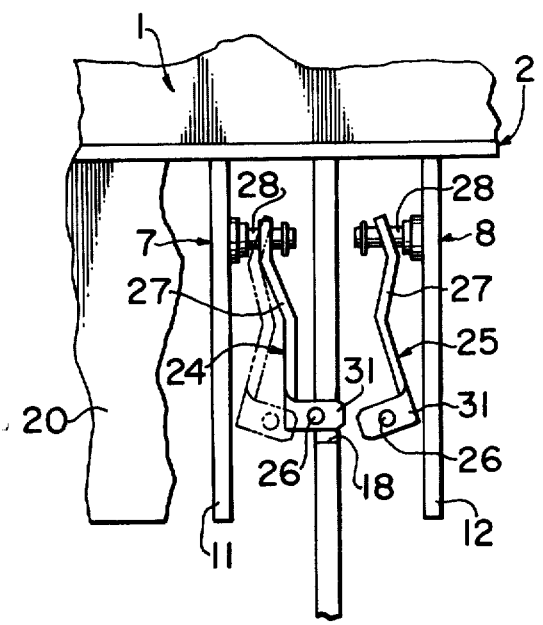
FIG. 4 is a plan view of another embodiment of the invention.
Figure 5:
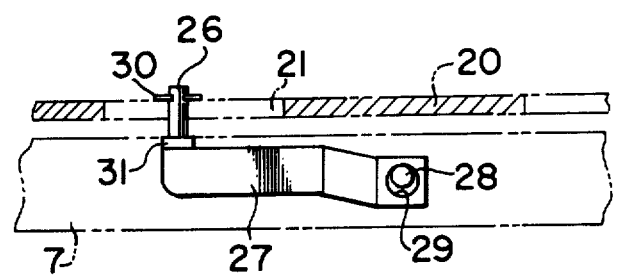
FIG. 5 is a side elevation of the interconnecting member shown in FIG. 4.

FIGS. 4 and 5 show a further embodiment which is similar to the one shown in FIGS. 1 and 2 except for the interconnecting members. In these Figures, parts corresponding to those described previously are designated by like numerals. A pair of interconnecting members generally shown at 24 and 25 each comprises a body portion 27 of a rigid material having a laterally extending arm 31 at is one end which carries a pin 26 extending upwardly from the plane of the body portion 27. At the other end, the body portions 27 are pivotally mounted on studs 28 which are secured to the side of extensions 11, 12 of the pair of tuning slides 7, 8, in a manner so that their arms 31 are disposed in opposing relationship. The body portion 27 is formed with an aperture 29 which engages the stud 28 and which has a sufficient diameter so as to permit an angular movement of the interconnecting members 24, 25 in respective planes which include the axis of the stud. The interconnecting members 24, 25 moves angularly between an operative position in which their arm 31 engages the notch 18 formed in the pushbutton slide 4 and an inoperative position which is spaced from the operative position. As in the previous embodiments, the upright pin 26 of each interconnecting member 24, 25 is received in the slot 21 of the shift plate 20, but in the present embodiment, the free end of the upright pin 26 extends above the shift plate 20 and has a washer 30 mounted thereon which assures proper orientation of the interconnecting members 24, 25 by preventing their movement about the stud 28. As the shift plate 20 is moved all the interconnecting members 24, 25 are displaced, one of the members moving from its inoperative to its operative position while the other moving from its operative to its inoperative position as in the previous embodiments. However, in the present embodiment, it will be noted that the load impressed on the arm 31 and body portion 27 of the interconnecting members 24, 25 and the stud 28 is along the length of the body portion 27, which can therefore satisfactorily withstand such load. Since the studs 28 can be provided on the side of the tuning slides 7, 8, it is a simple matter to achieve a satisfactory load bearing strength of the stud.

While the invention has been described in terms of specific embodiments, it should be understood that they are merely illustrative and not limitative of the invention and that various changes and modifications can be made therein without departing from the scope and spirit of the invention.

Having described the invention, what is claimed is:

1. An actuator for a pushbutton tuner comprising: a pushbutton slide; a pair of slideable tuning slides; interconnecting means for selectively connecting said pushbutton slide with either one of the pair of tuning slides; and movable shift means for controlling the interconnecting means, said interconnecting means including a pair of interconnecting members, each interconnecting member including a body portion comprised of flexible material secured at one end on the respective tuning slide, means at the other end of the body portion for selectively engaging with said pushbutton slide, and means responsive to movement of said shift means for effecting movement of one of said interconnecting members to is operative position and movement of the other to its inoperative position.

2. An actuator according to claim 1 in which said flexible material is composed of a resilient material.

3. An actuator according to claim 2 in which the resilient material comprises means for providing a snap action.

* * * * *